United States Patent
Kaltalioglu et al.

(10) Patent No.: US 10,297,546 B2
(45) Date of Patent: May 21, 2019

(54) INTERCONNECT STRUCTURES FOR A SECURITY APPLICATION

(71) Applicant: GLOBALFOUNDRIES Inc., Grand Cayman (KY)

(72) Inventors: Erdem Kaltalioglu, Newburgh, NY (US); Ronald G. Filippi, Jr., Wappingers Falls, NY (US); Ping-Chuan Wang, Hopewell Junction, NY (US); Cathryn Christiansen, Huntington, VT (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/652,594

(22) Filed: Jul. 18, 2017

(65) Prior Publication Data

US 2019/0027433 A1    Jan. 24, 2019

(51) Int. Cl.
*H01L 23/528* (2006.01)
*H01L 21/768* (2006.01)
*H01L 21/308* (2006.01)
*H01L 21/3065* (2006.01)
*H01L 23/522* (2006.01)
*H01L 21/306* (2006.01)

(52) U.S. Cl.
CPC ........ *H01L 23/528* (2013.01); *H01L 21/3065* (2013.01); *H01L 21/3081* (2013.01); *H01L 21/30604* (2013.01); *H01L 21/76813* (2013.01); *H01L 21/76879* (2013.01); *H01L 23/5226* (2013.01)

(58) Field of Classification Search
CPC ............... H01L 23/528; H01L 23/5226; H01L 21/30604; H01L 21/3065; H01L 21/3081; H01L 21/7613; H01L 21/76879
See application file for complete search history.

(56) References Cited

U.S. PATENT DOCUMENTS

| | | |
|---|---|---|
| 8,525,549 B1 | 9/2013 | Feng et al. |
| 9,166,588 B2 | 10/2015 | Feng et al. |

(Continued)

OTHER PUBLICATIONS

B. Skoric., et. al., "Physical aspects of digital security", Lecture notes v 1.6, retrieved from the internet at https://oncourse.tue.nl/2015/course/view.php?id=71, Aug. 2015.

(Continued)

*Primary Examiner* — Cheung Lee
*Assistant Examiner* — Stephen C Smith
(74) *Attorney, Agent, or Firm* — Thompson Hine LLP; Anthony Canale

(57) ABSTRACT

Interconnect structures for a security application and methods of forming an interconnect structure for a security application. A sacrificial masking layer is formed that includes a plurality of particles arranged with a random distribution. An etch mask is formed using the sacrificial masking layer. A hardmask is etched while masked by the etch mask to define a plurality of mask features arranged with the random distribution. A dielectric layer is etched while masked by the hardmask to form a plurality of openings in the dielectric layer that are arranged at the locations of the mask features. The openings in the dielectric layer are filled with a conductor to define a plurality of conductive features.

11 Claims, 3 Drawing Sheets

(56) References Cited

U.S. PATENT DOCUMENTS

| | | |
|---|---|---|
| 9,190,360 B2 | 11/2015 | Feng et al. |
| 2011/0163088 A1 | 7/2011 | Besling et al. |
| 2011/0254141 A1 | 10/2011 | Roest et al. |
| 2013/0233608 A1* | 9/2013 | Feng ............... H04L 9/3278 174/264 |
| 2014/0042627 A1* | 2/2014 | Edelstein ......... H04L 9/3278 257/758 |
| 2015/0137380 A1* | 5/2015 | in 't Zandt ......... H01L 23/564 257/773 |
| 2015/0207505 A1* | 7/2015 | Feng ............ H03K 19/00315 257/392 |
| 2016/0247770 A1 | 8/2016 | Li et al. |

OTHER PUBLICATIONS

Wikipedia, "Types of physical unclonable function", retrieved from the internet at https://en.wikipedia.org/wiki/Types_of_physical_unclonable_function on Jul. 18, 2017.

* cited by examiner

INTERCONNECT STRUCTURES FOR A SECURITY APPLICATION

BACKGROUND

The present invention relates to integrated circuits and semiconductor device fabrication and, more specifically, to interconnect structures for a security application and methods of forming an interconnect structure for a security application.

An interconnect structure may be formed by back-end-of-line (BEOL) processing and used to provide electrical connections with device structures fabricated on a substrate by front-end-of-line (FEOL) processing. Typical constructions for a BEOL interconnect structure include multiple metallization levels arranged in a stack. The metallization levels of the BEOL interconnect structure may be formed by layer deposition, lithography, etching, and polishing techniques characteristic of damascene processes.

A mechanism for preventing the unauthorized cloning of an integrated circuit is through the use of an on-chip physical unclonable function (PUF), which is a challenge-response mechanism in which the mapping between a challenge and the corresponding response exploits manufacturing process variations inside integrated circuits to impart uniqueness. For example, the PUF may be embodied in active device structures that generate a set of binary bits that can be read as the response.

The correlation among the binary bits generated by the PUF and read from different chips must be random in order to provide security. Nevertheless, the response from the PUF associated with a chip should remain fixed and static over time. However, active device structures are subject to distortion by operating conditions, such as voltage and temperature, and require complicated sensing circuits to initiate the challenge and detect the response.

Improved interconnect structures for a security application and methods of forming an interconnect structure for a security application are needed.

SUMMARY

According to an embodiment of the invention, a method includes forming a sacrificial masking layer that includes a plurality of particles arranged with a random distribution, forming an etch mask using the sacrificial masking layer, and etching a hardmask masked by the etch mask to define a plurality of mask features arranged with the random distribution. The method further includes etching a dielectric layer masked by the hardmask to form a plurality of openings in the dielectric layer that are arranged at the locations of the mask features, and filling the openings in the dielectric layer with a conductor to define a plurality of conductive features.

According to an embodiment of the invention, a structure includes a metallization level including a dielectric layer and a plurality of first conductive features arranged in the dielectric layer with a random distribution, a second conductive feature, and a third conductive feature connected by one of the first conductive features with the second conductive feature.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Figure 1:
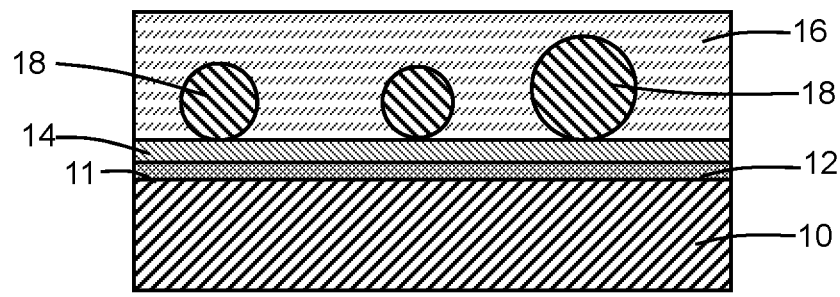
FIG. 1 is a cross-sectional view of a structure at an initial fabrication stage of a processing method in accordance with embodiments of the invention.

With reference to FIG. 1 and in accordance with embodiment of the invention, a dielectric layer 10 is provided for processing by back-end-of-line (BEOL) processes to form a metallization level of an interconnect structure. The dielectric layer 10 may be composed of an electrical insulator, such as an organic or inorganic dielectric material. Suitable inorganic dielectric materials for dielectric layers 10 may include, but are not limited to, silicon dioxide ($SiO_2$), fluorine-doped silicon glass (FSG), and combinations of these and other dielectric materials. Alternatively, the dielectric material constituting dielectric layer 10 may be characterized by a relative permittivity or dielectric constant that is less than the dielectric constant of silicon dioxide, which is about 3.9. Suitable low-k dielectric materials for the dielectric layer 10 include, but are not limited to, organic low-k dielectric materials, inorganic low-k dielectric materials, and combinations of these and other organic and inorganic dielectric materials. The dielectric material constituting the dielectric layer 10 may be deposited by spin-on application, chemical vapor deposition (CVD), etc.

A dielectric hardmask 12 and a metal hardmask 14 are formed in a layer stack on a top surface 11 of the dielectric layer 10. The dielectric hardmask 12 is located vertically between the metal hardmask 14 and the top surface 11 of the dielectric layer 10. The metal hardmask 14 may be composed of, for example, titanium nitride (TiN) or tantalum nitride (TaN), and the dielectric hardmask 12 may be composed of, for example, silicon dioxide ($SiO_2$).

A sacrificial masking layer 16 is formed as a coating on the metal hardmask 14. The sacrificial masking layer 16 may be composed of an organic spin-on material, such as an organic planarization layer (OPL) material applied by spin-coating. The sacrificial masking layer 16 may include particles 18 that are dispersed or distributed throughout the volume of the sacrificial layer. The particles 18 and sacrificial masking layer 16 may be composed of materials characterized by different etch selectivity. Through material selection and a choice of etch chemistry, the particles 18 may be removable selective to the material of the sacrificial masking layer 16 or, alternatively, the material of the sacrificial masking layer 16 may be removable selective to the particles 18. In an embodiment, the particles 18 may be composed of silicon having etch selectivity relative to organic spin-on materials. As used herein, the term "selective" in reference to a material removal process (e.g., etching) denotes that the material removal rate (i.e., etch rate) for the targeted material is higher than the material removal rate (i.e., etch rate) for at least another material exposed to the material removal process.

In an embodiment, the particles 18 may have a spherical geometrical shape. Alternatively, the particles 18 may have a different geometrical shape, including non-spherical geometrical shapes and/or irregular geometrical shapes, or may have several different geometrical shapes in the distribution. The particles 18 are dimensioned to generate masking structures of appropriate dimensions to provide links between conductive features, as described hereinbelow. The particles 18 may be dispersed with a random distribution of positions throughout the volume of the sacrificial masking layer 16, as best apparent in FIG. 2, that is established by a stochastic process, for example, at the time of application of the sacrificial masking layer 16. The particles 18 may locate at or near the bottom surface of the sacrificial masking layer 16 (i.e., at or near the top surface of the dielectric hardmask 12).

Figure 2:
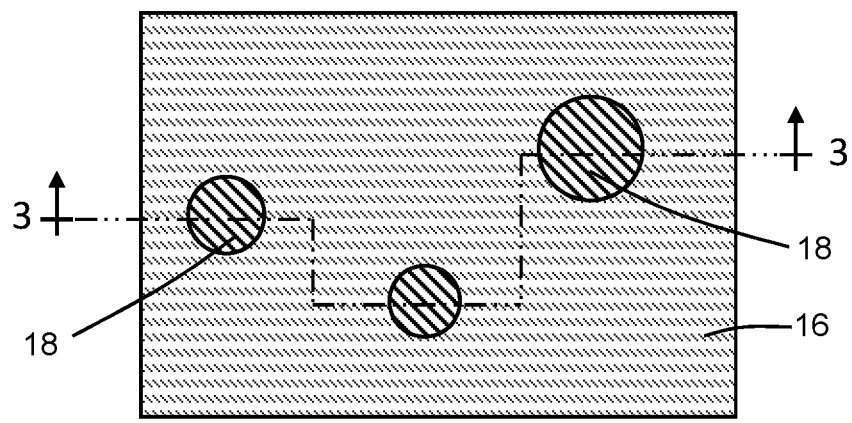
FIG. 2 is a top view of the structure at a fabrication stage of the processing method subsequent to FIG. 1.
Figure 3:
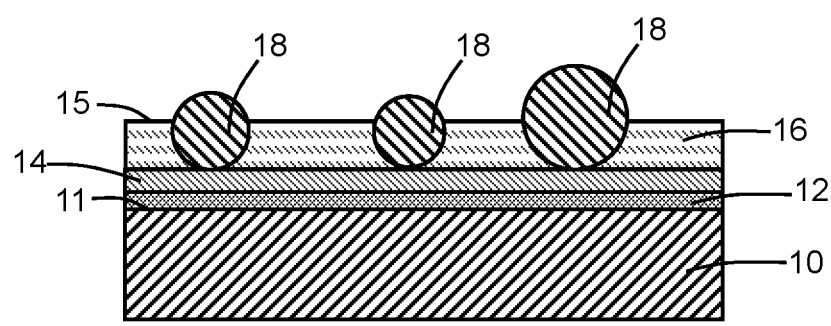
FIG. 3 is a cross-sectional view taken generally along line 3-3 of FIG. 2.

With reference to FIGS. 2, 3 in which like reference numerals refer to like features in FIG. 1 and at a subsequent fabrication stage, the top surface 15 of the sacrificial masking layer 16 is recessed to reduce its thickness and to an extent necessary to expose or reveal the particles 18. For example, a reactive ion etching (RIE) process using an oxygen plasma may be used to recess the top surface 15 of the sacrificial masking layer 16. The top surface 15 may be planar before the top surface 15 is recessed and planar with topology introduced by the exposed particles 18.

Figure 4:
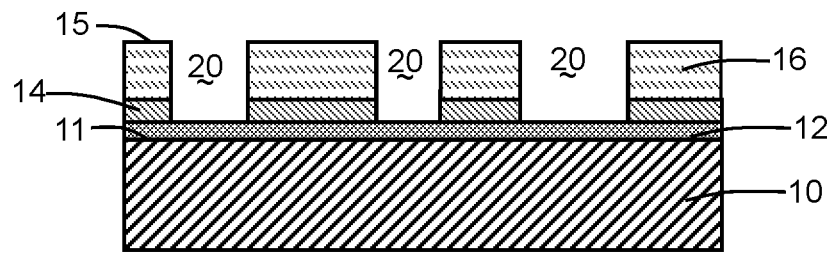
FIGS. 4 and 5 are cross-sectional views of the structure at successive fabrication stages subsequent to FIG. 3.

With reference to FIG. 4 in which like reference numerals refer to like features in FIG. 3 and at a subsequent fabrication stage, the particles 18 may be removed selective to the sacrificial masking layer 16 in order to form openings 20 in the sacrificial masking layer 16 at the former locations of the removed particles 18 and thereby form an etch mask. In an embodiment, the particles 18 may be removed by a wet chemical etching process or a reactive ion etching (RIE) process with an etch chemistry selected to remove the material of the particles 18 selective to the material of the sacrificial masking layer 16. In view of their removal, the particles 18 do not persist in the final structure of the physical unclonable function (PUF).

After the particles are removed, the sidewalls of the openings 20 extend through the thickness of the sacrificial masking layer 16 to the top surface of the metal hardmask 14. The sidewalls bordering the openings 20 are depicted as planar in the representative embodiment. However, in alternative embodiments, the sidewalls bordering the opening 20 may be curved in shape or otherwise non-planar and/or irregular in shape. The sidewall shape will at least in part reflect the shape of the removed particles 18.

An etching process is then used to extend the openings 20 through the full thickness of the metal hardmask 14 to the top surface of the dielectric hardmask 12. The etch chemistry for the etching process is selected to remove the material of the metal hardmask 14 selective to the material of the dielectric hardmask 12. The dimensions and geometries of the openings 20 in the metal hardmask 14 are directly related to the dimensions and geometries of the particles 18 that formerly occupied the openings 20.

Figure 5:
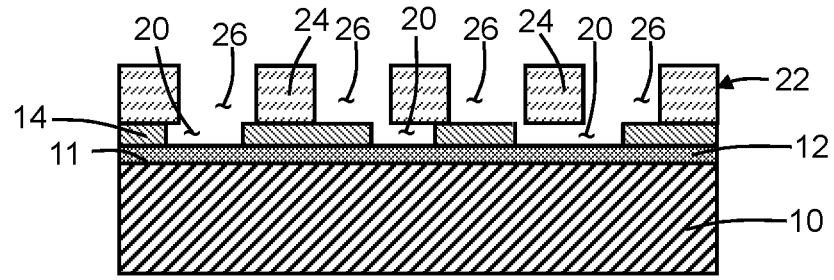

With reference to FIG. 5 in which like reference numerals refer to like features in FIG. 4 and at a subsequent fabrication stage, after the openings 20 are extended through the metal hardmask 14, the sacrificial masking layer 16 may be removed with, for example, the same etching process used to recess its top surface 15. A lithography stack 22 is applied and patterned to incorporate a pattern of lines 24 and spaces 26 between the lines 24. The openings 20 in the metal hardmask 14 are superimposed with the pattern of lines 24 and spaces 26. The lithography stack 22 may include, for example, an anti-reflective coating and a layer of photoresist. The patterned lithography stack 22 and openings 20 in the metal hardmask 14 define an etch mask.

Figure 6:
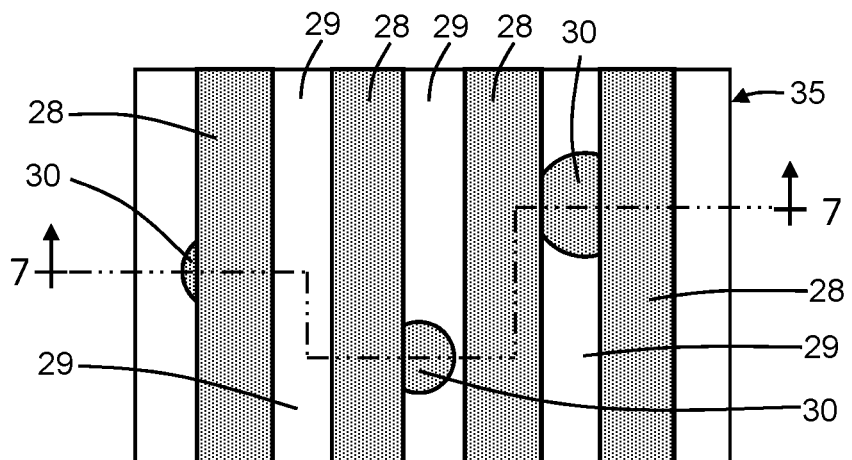
FIG. 6 is a top view of the structure at a fabrication stage of the processing method subsequent to FIG. 5.
Figure 7:
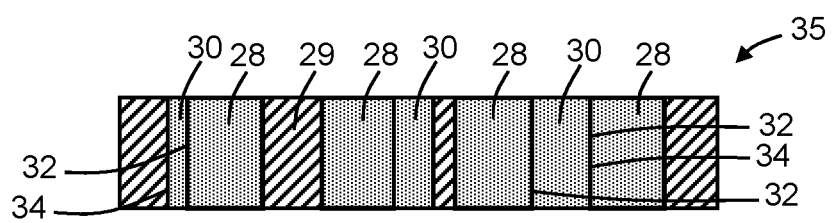
FIG. 7 is a cross-sectional view taken generally along line 7-7 of FIG. 6.

With reference to FIGS. 6, 7 in which like reference numerals refer to like features in FIG. 5 and at a subsequent fabrication stage, the pattern of openings 20 in the metal hardmask 14 and the pattern of lines 24 and spaces 26 in the lithography stack 22 are transferred to the dielectric hardmask 12 with one or more etching processes. The lithography stack 22 is then removed to expose the metal hardmask 14. The dielectric layer 10 is subsequently patterned with an etching process, such as a reactive ion etching (RIE) process, using the patterned dielectric hardmask 12 as an etch mask to form trenches 32 in the dielectric layer 10 that are spatially correlated with the spaces 26 and openings 34 in the dielectric layer 10 that are spatially correlated with the openings 20. The trenches 32 and openings 34 are concurrently formed and may extend to the same depth in the patterned dielectric layer 10.

Conductive features 28 are formed in the trenches 32 and conductive features 30 are formed in the openings 34. The conductive features 28 formed in trenches 32 are spatially correlated with the spaces 26 between the lines 24 of the lithography stack 22, and the conductive features 30 formed in openings 34 are spatially correlated with the openings 20 and with the former positions of the randomly-distributed particles 18 removed to generate the openings 20. Spaces 29 between adjacent pairs of conductive features 28 are correlated in position with the lines 24 of the lithography stack 22 and represent intact volumes of the dielectric layer 10. The metal hardmask 14 is removed after the dielectric layer 10 is patterned.

The dielectric layer 10 and the conductive features 28, 30 embedded in the dielectric layer 10 define a BEOL metallization level 35 that may be one of multiple BEOL metallization levels. The conductive features 28, 30 may be composed of a primary conductor that is a low-resistivity metal formed using a deposition process, such as copper (Cu) formed by electroplating or electroless deposition. A liner (not shown) comprised of titanium (Ti), titanium nitride (TiN), tantalum (Ta), tantalum nitride (TaN), or a layered combination of these materials (e.g., a bilayer of TaN/Ta) may be applied to the trenches 32 and openings 34 in the dielectric layer 10 before filling with the primary electrical conductor.

The conductive features 28 and the trenches 32 in which the conductive features 28 are formed may be arranged as parallel lines, and the conductive features 30 and the openings 34 in which the conductive features 30 are formed have a random arrangement. In the latter regard, the conductive features 30 constitute random perturbations superimposed on the set of intra-level conductive features 28 and spaces 29. In particular, the conductive features 30 may partially overlap with the spaces 29, as well as with the conductive features 30, in a random manner. The conductive features 30 project into the spaces 29 in order to locally narrow the spaces 29 by different amounts.

The conductive features 30 are randomly distributed relative to the conductive features 28 and spaces 29. The conductive features 30 may electrically and physically connect adjacent conductive features 28, which are in the same metallization level 35, to define respective electrical shorts. Other of the conductive features 30 may merely project outwardly to provide a perturbation in the otherwise planar sidewall of the conductive features 28, but do not bridge between adjacent conductive features 28 to provide a connection and an electrical short.

The arrangement of the conductive features 28, 30 providing the random electrical shorts is non-volatile and the physical unclonable function (PUF) is embodied in a simple and compact BEOL structure. The conductive features 28, 30 may be subjected to an optional electrical burn-in that is intended to establish a more stable non-volatile state for the conductive features 28, 30 that may have a higher probability of remaining fixed and static over time. The electrical burn-in may reduce the likelihood of changes (e.g., shorting due to tight dimensions between a conductive feature 30 and a conductive feature 28) that might otherwise occur over time when the associated chip is powered and in use. Representative conditions for the burn-in may include applying a voltage with a time-based ramp over a given time interval (e.g., 10 seconds to 20 seconds) that increases toward a given peak voltage that may be equal to a chip operating voltage multiplied by a factor of two to ten.

The conductive features 28 extend to device structures on the chip, and may be used to sense binary bits based on whether conductive features 28 are shorted to each other by one of the conductive features 30 or not shorted. The combination of bits, which is random, can be decoded to authenticate a particular chip associated with the PUF provided in the aggregate by the collection of conductive features 28, 30.

Figure 8:
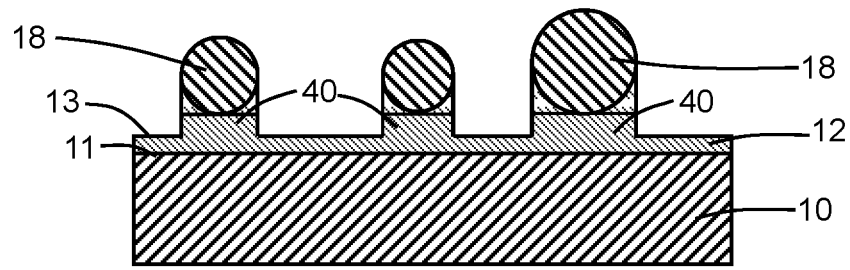
FIGS. 8 and 9 are cross-sectional views of a structure at successive fabrication stages of a processing method in accordance with embodiments of the invention.

With reference to FIG. 8 in which like reference numerals refer to like features in FIG. 1 and in accordance with embodiments of the invention, the dielectric hardmask 12 may be arranged in direct contact with the dielectric layer 10, and the sacrificial masking layer 16 and particles 18 may be formed directly on the dielectric hardmask 12. The particles 18 are randomly distributed in the sacrificial masking layer 16, as discussed hereinabove. The sacrificial masking layer 16 is removed selectively to the particles 18 using, for example, an oxygen plasma in a reactive ion etching (ME) process. Some of the material of the sacrificial masking layer 16 between the particles 18 and the dielectric layer 10 may be masked and retained, and may serve to bond the particles 18 with the top surface 11 of the dielectric layer 10 during subsequent processing.

After the sacrificial masking layer 16 is removed, the top surface 13 of the dielectric hardmask 12 is recessed, but not removed, by an etching process, such as a reactive ion etching (ME) process, with the particles 18 operating as an etch mask. The particles 18 function as an etch mask such that regions 40 of the dielectric hardmask 12 are preserved with the full layer thickness in comparison with the reduced thickness of the surrounding regions of the dielectric hardmask 12. In a manner similar to the openings 20, the regions 40 of increased thickness in the dielectric hardmask 12 define the locations in the dielectric layer 10 at which the conductive feature 30 are formed.

Figure 9:
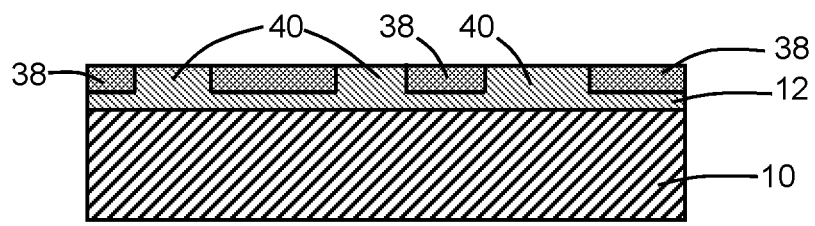

With reference to FIG. 9 in which like reference numerals refer to like features in FIG. 8 and at a subsequent fabrication stage, the particles 18 are removed selective to the dielectric hardmask 12. In an embodiment, the particles 18 may be removed by a wet chemical etching process or a reactive ion etching (RIE) process with an etch chemistry selected to remove the material of the particles 18 selective to the material of the dielectric hardmask 12.

A metal hardmask 38 is deposited on the dielectric hardmask 12, and planarized using a chemical-mechanical polishing (CMP) process to expose the top surface of the regions 40 of the dielectric hardmask 12. The metal hardmask 38 fills the open spaces surrounding the regions 40 of the dielectric hardmask 12, and may be composed of, for example, titanium (Ti), titanium nitride (TiN), tantalum (Ta), or tantalum nitride (TaN).

Processing continues as described in the context of FIGS. 4 and 5 for forming the structure shown in FIG. 5. The lines 24 and spaces 26 of the lithography stack 22 are transferred to the metal hardmask 38, and are subsequently transferred as a pattern of lines 24 and spaces 26 to the dielectric hardmask 12. During the transfer of the pattern of lines 24 and spaces 26, the regions 40 of the dielectric hardmask 12 are removed by the etching process to define the openings 20 in the dielectric hardmask 12 that are superimposed on the pattern of lines 24 and spaces 26. The openings 20, lines 24, and spaces 26 define the etch mask that is used to etch the dielectric layer 10.

Figure 10:
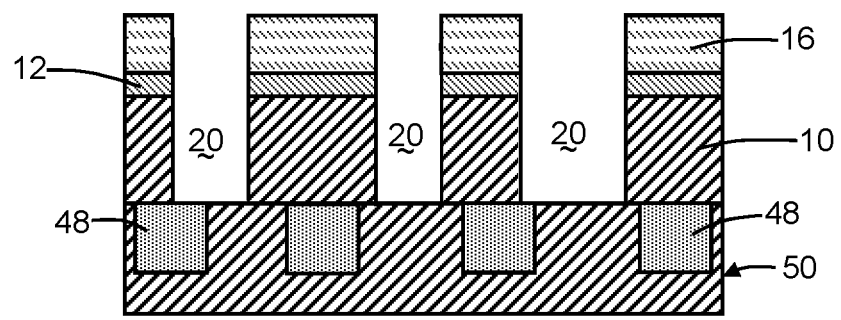
FIGS. 10 and 11 are cross-sectional views of a structure at successive fabrication stages of a processing method in accordance with embodiments of the invention.

With reference to FIG. 10 in which like reference numerals refer to like features in FIG. 3 and in accordance with embodiments of the invention, the sacrificial masking layer 16 and particles 18 may be formed directly on the dielectric hardmask 12, which is arranged in direct contact with the dielectric layer 10, and may be recessed as described herein above to reduce its thickness and to an extent necessary to expose or reveal the particles 18. The particles 18 are randomly distributed in the sacrificial masking layer 16.

The particles 18 are removed selective to the material of the sacrificial masking layer 16 to create the openings 20 in the sacrificial masking layer 16. An etching process with an etch chemistry selected to remove the material of the dielectric hardmask 12 selective to the material of the dielectric layer 10 is then used to extend the openings 20 through the full thickness of the dielectric hardmask 12 to the top surface 11 of the dielectric layer 10. An etching process with an etch chemistry selected to remove the material of the dielectric layer 10 selective to the material of the dielectric hardmask 12 is then used to extend the openings 20 to a given depth into the dielectric layer 10.

Figure 11:
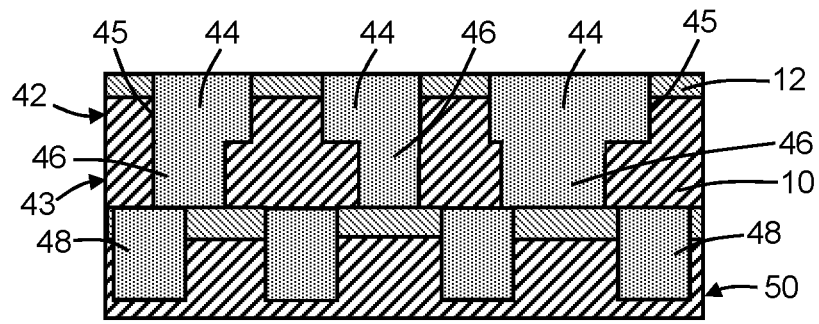

With reference to FIG. 11 in which like reference numerals refer to like features in FIG. 10 and at a subsequent fabrication stage, conductive features 44 are formed in the dielectric layer 10 as part of a via-first damascene process by, for example, forming trenches 45 in the dielectric layer 10 using a reactive ion etching process and an etch mask, followed by filling the trenches 45 filled with a conductor to form conductive features 44. The conductor also fills the openings 20 in the dielectric layer 10 to form conductive features 46. The conductive features 44 embedded in the dielectric layer 10 form a metallization level 42 and the conductive features 46 embedded in the dielectric layer 10 form a metallization level 43 that is located vertically between the metallization level 42 and the metallization level 50. The conductive features 46 are randomly distributed relative to the conductive features 44 due to the random distribution of the particles 18 when forming the openings 20, and may randomly land on conductive features 48 in the underlying metallization level 50.

The conductive features 46 in metallization level 43 that land on conductive features 48 create a vertical physical and electrical contact between one of the conductive features 44 in the metallization level 42 and one of the conductive features 48 in the metallization level 50. The conductive features 46 that do not land on one of the conductive features 48 fail to establish physical and electrical contact with one of the conductive features 44. These two types of structures provide respective vertical closed circuits and vertical open circuits furnishing the different binary bits used to provide the PUF.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction perpendicular to the horizontal, as just defined. The term "lateral" refers to a direction within the horizontal plane. Terms such as "above" and "below" are used to indicate positioning of elements or structures relative to each other as opposed to relative elevation.

A feature "connected" or "coupled" to or with another element may be directly connected or coupled to the other element or, instead, one or more intervening elements may be present. A feature may be "directly connected" or "directly coupled" to another element if intervening elements are absent. A feature may be "indirectly connected" or "indirectly coupled" to another element if at least one intervening element is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method comprising:
   forming a sacrificial masking layer that includes a plurality of particles arranged with a first random distribution;
   forming a first etch mask by selectively removing the particles from the sacrificial masking layer to define a first plurality of openings in the sacrificial masking layer that have a second random distribution identical to the first random distribution of the particles;
   etching a first hardmask masked by the first etch mask to define a second plurality of openings arranged with a third random distribution identical to the second random distribution of the first plurality of openings;
   etching a dielectric layer masked by the first hardmask to form a third plurality of openings in the dielectric layer that are arranged with a fourth random distribution identical to the third random distribution of the second plurality of openings; and
   filling the third plurality of openings in the dielectric layer with a conductor to define a first plurality of conductive features.

2. The method of claim 1 further comprising:
   after etching the first hardmask, removing the first etch mask;
   etching the first hardmask using a second etch mask to form a pattern that includes a plurality of lines and a plurality of spaces arranged to alternate with the lines; and
   forming a plurality of trenches in the dielectric layer based on the pattern when the dielectric layer is etched, wherein the third plurality of openings in the dielectric layer are superimposed on the trenches in the dielectric layer.

3. The method of claim 2 further comprising
   filling the trenches with the conductor to define a second plurality of conductive features,
   wherein the first plurality of conductive features and the second plurality of conductive features are located in a metallization level, and at least one of the first plurality of conductive features connects a pair of the second plurality of conductive features to provide an electrical short.

4. The method of claim 3 further comprising:
   applying a ramped voltage to the second plurality of conductive features to cause a change in the at least one of the first plurality of conductive features to provide the electrical short connecting the pair of the second plurality of conductive features.

5. The method of claim 2 further comprising
   filling the plurality of trenches with the conductor to define a second plurality of conductive features,
   wherein the first plurality of conductive features are located in a first metallization level and the second plurality of conductive features are located in a second metallization level, and at least one of the first plurality of conductive features connects one of the second plurality of conductive features with a third conductive feature in a third metallization level to provide an electrical short.

6. The method of claim 2 wherein the third plurality of openings are formed in the dielectric layer before the plurality of trenches are formed in the dielectric layer.

7. The method of claim 2 wherein the third plurality of openings and the plurality of trenches are concurrently formed in the dielectric layer.

8. A method comprising:
   forming a sacrificial masking layer that includes a plurality of particles arranged with a first random distribution;
   forming a first etch mask by selectively removing the sacrificial masking layer relative to the plurality of particles such that the plurality of particles provide the first etch mask;
   etching a first hardmask masked by the first etch mask to recess a top surface of the first hardmask over areas not masked by the plurality of particles and define a plurality of regions of increased thickness in the first hardmask that are arranged with a second random distribution identical to the first random distribution;
   etching a dielectric layer to form a plurality of openings in the dielectric layer that are arranged with a third random distribution identical to the second random distribution of the regions of increased thickness of the first hardmask; and filling the plurality of openings in the dielectric layer with a conductor to define a first plurality of conductive features.

9. The method of claim 8 further comprising:

after the first hardmask is etched, removing the first etch mask;

forming a second hardmask surrounding the plurality of regions of increased thickness;

etching the second hardmask using a second etch mask to form a pattern that includes a plurality of lines and a plurality of spaces arranged to alternate with the lines; and forming a plurality of trenches in the dielectric layer based on the pattern when the dielectric layer is etched, wherein the plurality of openings in the dielectric layer are superimposed on the plurality of trenches in the dielectric layer.

10. The method of claim 9 further comprising filling the plurality of trenches with the conductor to define a second plurality of conductive features, wherein the first plurality of conductive features and the second plurality of conductive features are located in a metallization level, and at least one of the first plurality of conductive features connects a pair of the second plurality of conductive features to provide an electrical short.

11. The method of claim 10 further comprising:

applying a ramped voltage to the second plurality of conductive features to cause a change in the at least one of the first plurality of conductive features to provide the electrical short connecting the pair of the second plurality of conductive features.

* * * * *